United States Patent
Terahara et al.

(10) Patent No.: US 8,835,327 B2
(45) Date of Patent: Sep. 16, 2014

(54) METHOD OF MANUFACTURING SEMICONDUCTOR DEVICE

(71) Applicant: Fujitsu Semiconductor Limited, Kanagawa (JP)

(72) Inventors: Masanori Terahara, Kuwana (JP); Hikaru Kokura, Kuwana (JP); Akihiro Hasegawa, Nagoya (JP); Atsuo Fushida, Kokubunji (JP); Fumihiko Akaboshi, Yokkaichi (JP)

(73) Assignee: Fujitsu Limited, Kawasaki (JP)

( * ) Notice: Subject to any disclaimer, the term of this patent is extended or adjusted under 35 U.S.C. 154(b) by 2 days.

(21) Appl. No.: 13/747,046

(22) Filed: Jan. 22, 2013

(65) Prior Publication Data

US 2013/0244405 A1    Sep. 19, 2013

(30) Foreign Application Priority Data

Mar. 15, 2012  (JP) .................................. 2012-058582

(51) Int. Cl.
*H01L 21/302*  (2006.01)
(52) U.S. Cl.
USPC .......................................... 438/715; 361/234
(58) Field of Classification Search
USPC ................... 438/715, 710; 361/234
See application file for complete search history.

(56) References Cited

U.S. PATENT DOCUMENTS

| | | | |
|---|---|---|---|
| 6,236,555 B1 * | 5/2001 | Leeser .......................... | 361/234 |
| 6,252,758 B1 | 6/2001 | Nagao et al. | |
| 6,416,618 B2 | 7/2002 | Tsuchihashi et al. | |
| 6,589,611 B1 * | 7/2003 | Li et al. .......................... | 427/579 |
| 6,975,497 B2 | 12/2005 | Nagao et al. | |
| 2010/0014208 A1 * | 1/2010 | Tatsuhiko et al. ............. | 361/234 |

FOREIGN PATENT DOCUMENTS

| | | |
|---|---|---|
| JP | 5-304196 A | 11/1993 |
| JP | 2000-21964 A | 1/2000 |
| JP | 2000-260855 A | 9/2000 |
| JP | 2005-38947 A | 2/2005 |

* cited by examiner

*Primary Examiner* — Reema Patel
(74) *Attorney, Agent, or Firm* — Westerman, Hattori, Daniels & Adrian, LLP

(57) ABSTRACT

A method of manufacturing a semiconductor device disclosed herein includes: mounting a substrate on an electrostatic chuck placed inside a chamber, the electrostatic chuck having a first temperature and the substrate being retained in advance in an atmosphere having a second temperature lower than the first temperature; fixing the substrate onto the electrostatic chuck by applying a voltage to the electrostatic chuck; heating the electrostatic chuck to a third temperature higher than the first temperature and the second temperature after mounting the substrate; and processing the substrate after the heating.

7 Claims, 12 Drawing Sheets

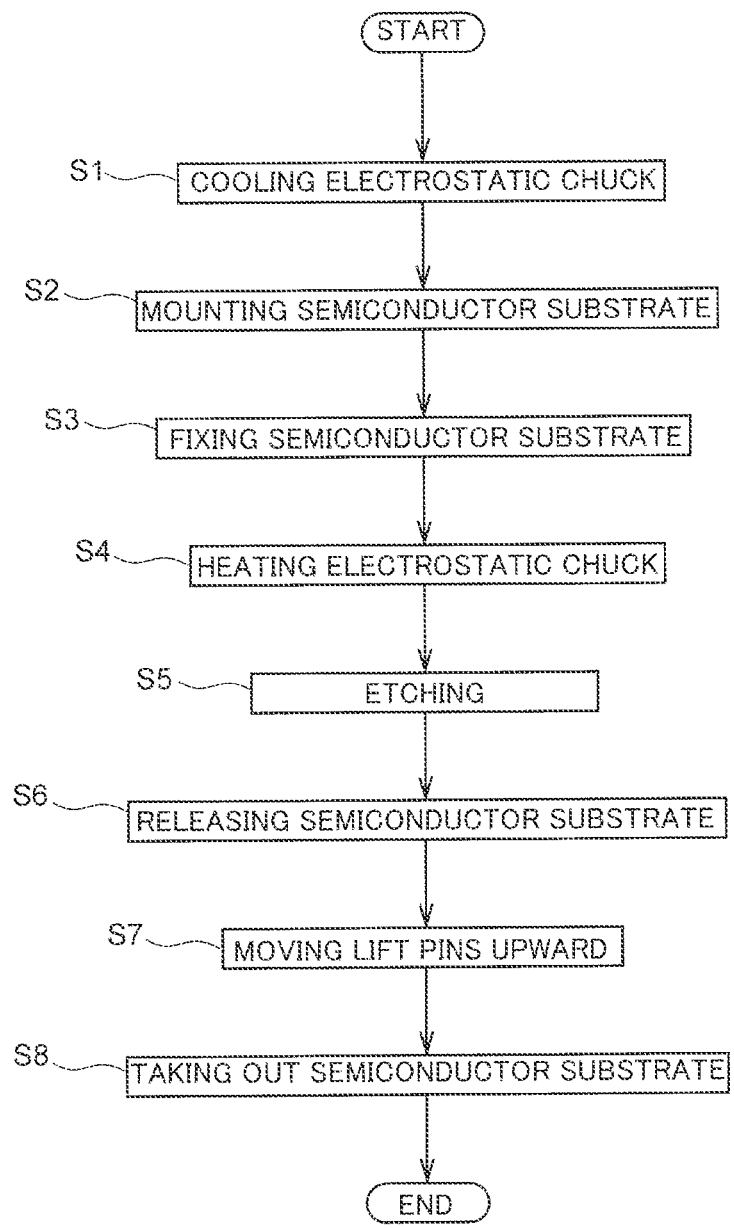

METHOD OF MANUFACTURING SEMICONDUCTOR DEVICE

CROSS-REFERENCE TO RELATED APPLICATION

This application is based upon and claims the benefit of priority of the prior Japanese Patent Application No. 2012-58582, filed on Mar. 15, 2012, the entire contents of which are incorporated herein by reference.

FIELD

The embodiments discussed herein are related to a method of manufacturing a semiconductor device.

BACKGROUND

A semiconductor device such as an LSI is manufactured by undergoing various processes including etching, CVD (chemical vapor deposition), and the like. A semiconductor manufacturing apparatus configured to perform these processes includes a substrate pedestal located inside a chamber. A semiconductor substrate is heated to a given temperature by the substrate pedestal and is then subjected to various processes in this state.

It is known that particles may be generated by rubbing between the substrate pedestal and the semiconductor substrate in the course of the processes because there is a difference in the thermal expansion coefficient between the substrate pedestal and the semiconductor substrate. Such particles lead to reduction in yield of semiconductor devices and it is therefore preferable to suppress generation of the particles in order to improve the yield.

There is proposed a method applicable to a case of using an electrostatic chuck as the substrate pedestal. The method intends to suppress generation of particles by using a pulse voltage as a voltage for generating an electrostatic attractive force after a semiconductor substrate is mounted on the electrostatic chuck.

According to this method, the semiconductor substrate is allowed to slide on the electrostatic chuck because the electrostatic attractive force disappears in a period when the voltage is set to 0 V. Thus, a stress attributed to a difference in the thermal expansion coefficient between the semiconductor substrate and the electrostatic chuck is relaxed and the number of particles is supposed to be reduced as a consequence.

However, if the electrostatic attractive force is caused to disappear frequently as described above, then it takes a long time for starting a process after the semiconductor substrate is mounted on the electrostatic chuck because generation of a sufficient electrostatic attractive force for fixing the semiconductor substrate uses time.

The techniques related to this application are disclosed in Japanese Laid-open Patent Publications No. 2000-21964, No. 2000-260855, No. 2005-38947, and No. 05-304196.

SUMMARY

According to an aspect disclosed herein, a method of manufacturing a semiconductor device includes: mounting a substrate on an electrostatic chuck placed inside a chamber, the electrostatic chuck having a first temperature and the substrate being retained in advance in an atmosphere having a second temperature lower than the first temperature; fixing the substrate onto the electrostatic chuck by applying a voltage to the electrostatic chuck; heating the electrostatic chuck to a third temperature higher than the first temperature and the second temperature after mounting the substrate; and processing the substrate after the heating.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 is a flowchart illustrating a method of controlling the electrostatic chuck of the embodiment;

DESCRIPTION OF EMBODIMENTS

Researches conducted by the inventor of the present application will be explained prior to description of embodiments.

Figure 1:
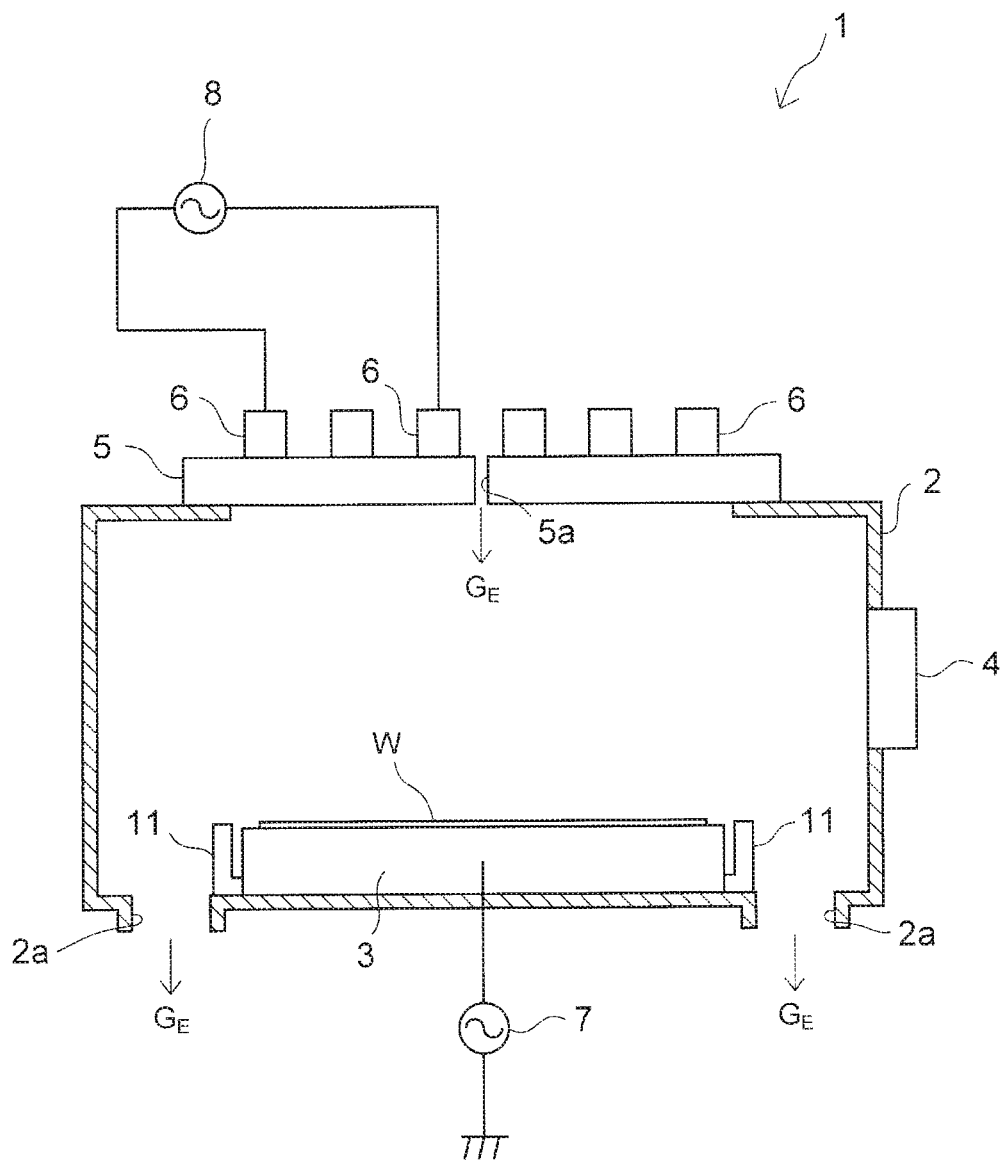
FIG. 1 is a block diagram of a semiconductor manufacturing apparatus used for researches.

FIG. 1 is a block diagram of a semiconductor manufacturing apparatus used in the researches.

The semiconductor manufacturing apparatus 1 is an ICP (inductively coupled plasma) etching apparatus which includes a chamber 2 housing an electrostatic chuck 3. The chamber 2 may be one of multiple chambers or a single chamber.

The electrostatic chuck 3 is provided at a bottom surface of the chamber 2 and is electrically connected to a first high-frequency power source 7 used for biasing. A protection ring 11 made of quartz is provided beside the electrostatic chuck 3 in order to prevent the electrostatic chuck 3 from being damaged by plasmas.

In addition, induction coils 6 are provided above the chamber 2 while interposing a quartz plate 5 in-between. Among them, the quartz plate 5 has a supply port 5a for an etching gas $G_E$ while the induction coils 6 are electrically connected to a second high-frequency power source 8 used for plasma generation.

Here, a ceramic plate may be provided instead of the quartz plate 5.

Moreover, the chamber 2 includes exhaust ports 2a at the bottom surface, and a quartz window 4 provided on a side surface thereof and used for observing the inside of the chamber 2.

In actual use, the etching gas $G_E$ is supplied from the supply port 5a into the chamber 2 while discharging the etching gas $G_E$ from the exhaust ports 2a. In this state, when high-frequency power having a frequency of 13.56 MHz is applied from the second high-frequency power source 8 to the induction coils 6, the etching gas $G_E$ is transformed into a plasma. Subsequently, when high-frequency power having a frequency of 13.56 MHz is applied from the first high-frequency power source 7 to the electrostatic chuck 3, the etching gas $G_E$ transformed into the plasma is attracted to the electrostatic chuck 3 and a semiconductor substrate W on the electrostatic chuck 3 is subjected to etching accordingly.

Figure 2:
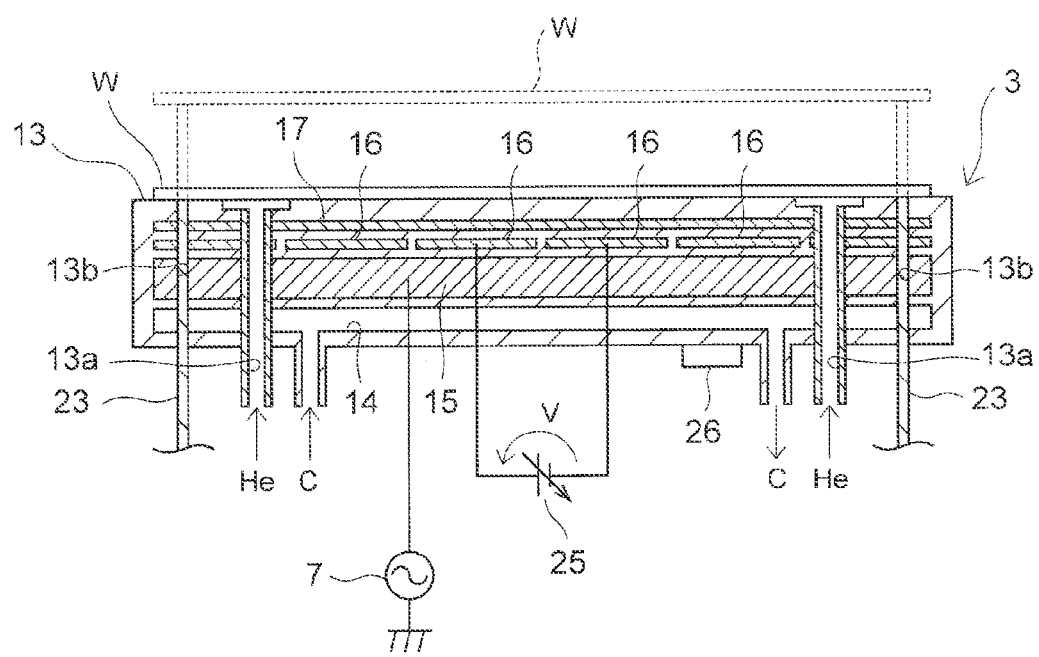
FIG. 2 is a cross-sectional view of an electrostatic chuck.

FIG. 2 is a cross-sectional view of the above-described electrostatic chuck 3.

The electrostatic chuck 3 includes a main body 13 made of alumina ($Al_2O_3$) and the like. In addition, a coolant flow channel 14, a high-frequency electrode 15, chuck electrodes 16, and a heater 17 are provided inside the main body 13 from bottom up in this order.

Among them, a coolant C such as cooling water cooled by an unillustrated chiller is supplied to the coolant flow channel 14. Meanwhile, the high-frequency electrode 15 is electrically connected to the aforementioned first high-frequency power source 7.

In the meantime, two polarities of a direct-current voltage V generated by a direct-current power source 25 are applied to the chuck electrodes 16. Meanwhile, the heater 17 is a heater of a resistive heating type, for example, which is provided in a surface layer of the main body 13.

The main body 13 is also provided with first holes 13a for helium gas He and second holes 13b for lift pins. Among them, helium gas He used for cooling is supplied to the first holes 13a and the semiconductor substrate W is cooled from its back surface by the helium gas He.

Meanwhile, a vertically movable lift pin 23 is inserted through each of the second holes 13b.

As illustrated with dotted lines, the lift pins 23 move upward when the semiconductor substrate W is accepted in the chamber 2 or when the semiconductor substrate W is taken out of the chamber 2. This movement forms a clearance between the semiconductor substrate W and the electrostatic chuck 3, which allows entry of a transport robot arm.

Meanwhile, when the semiconductor substrate W is subjected to etching, the lift pins 23 move downward to bring the back surface of the semiconductor substrate W into contact with an upper surface of the electrostatic chuck 3, and the semiconductor substrate W is fixed to the electrostatic chuck 3 by an electrostatic attractive force generated by the chuck electrodes 16.

In the electrostatic chuck 3, the semiconductor substrate W is heated by applying electricity to and thereby turning on the heater 17. Etching is promoted by heating the semiconductor substrate W as described above. In addition, a volatile reaction product generated by etching is quickly discharged from the chamber 2.

On the other hand, either a pressure of the helium gas He to be supplied from the first holes 13a may be increased or a flow rate of the coolant C flowing on the coolant flow channel 14 may be increased in order to bring the temperature of the semiconductor substrate W down to a room temperature (about 20° C.). An etching reaction is suppressed by lowering the temperature as described above. As a consequence, processing accuracy of etching with a resist film serving as an etching mask is improved by preventing wear of the resist film or reducing deformation of the resist film.

Note that the heater 17 does not always have to be turned off at the time of lowering the temperature. Instead, the heater 17 may be constantly turned on while reducing a current to be fed to the heater, for example.

Further, it may be also possible to improve etching shift, etching selectivity, in-plane uniformity of an etching amount, and the like by controlling the temperature of the electrostatic chuck 3 in the course of etching.

Meanwhile, a thermometer 26 such as a thermocouple for monitoring the temperature of the electrostatic chuck 3 is provided on a back surface of the main body 13. In the following description, the temperature of the electrostatic chuck 3 means the temperature measured with the thermometer 26.

In the meantime, when etching is started, the semiconductor substrate W is mounted on the electrostatic chuck 3 by moving the lift pins 23 downward. However, the semiconductor substrate W is in a state of standby in an atmosphere outside the chamber 2 before being mounted. The semiconductor substrate W stands by in any of an unillustrated load lock chamber, an unillustrated transfer chamber, and the like located outside the chamber 2. The atmosphere in the chambers other than the chamber 2 is set to a room temperature.

For this reason, if the electrostatic chuck 3 is always heated to a temperature higher than the room temperature before the semiconductor substrate W is mounted thereon, a temperature difference occurs between the semiconductor substrate W and the electrostatic chuck 3 at the point when the semiconductor substrate W is mounted thereon. Such a temperature difference is thought to be a cause of expansion of the semiconductor substrate W and generation of particles.

With that in mind, the inventor of the present application has conducted researches on aspects of changes in the number of particles at various temperatures of the electrostatic chuck 3 at the point when the semiconductor substrate W is mounted thereon.

Figure 3:
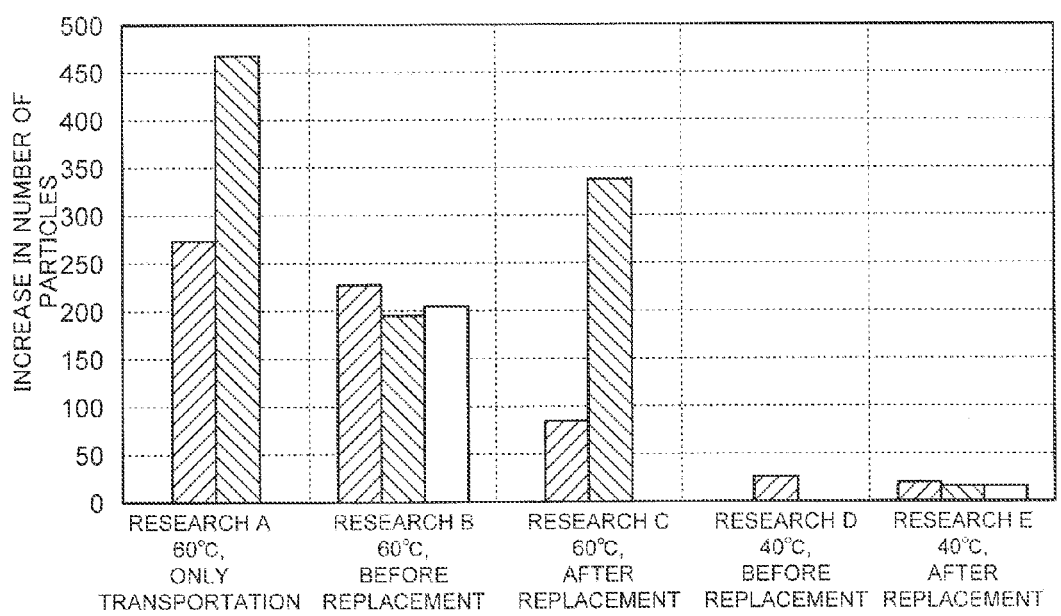
FIG. 3 is a view illustrating research results concerning aspects of changes in the number of particles depending on the temperature of the electrostatic chuck.

FIG. 3 illustrates results of the researches.

In each of researches A to E in FIG. 3, an increase in the number of particles on the semiconductor substrate W is counted by comparing a state before the semiconductor substrate W is put into the chamber 2 with a state after the semiconductor substrate W is taken out of the chamber 2.

In the researches, a silicon substrate having bare silicon surfaces is used as the semiconductor substrate W, and the temperature of the semiconductor substrate W before being put into the chamber 2 is set to a room temperature.

Meanwhile, among the researches A to E, a research having a plurality of bars in the corresponding graph represents the research conducted for a plurality of times under the same conditions.

In the research A, the temperature of the electrostatic chuck 3 is set to 60° C. Then, after the semiconductor substrate W is brought into contact with the electrostatic chuck 3 at 60° C. by moving the lift pins 23 (see FIG. 2) downward, the lift pins 23 are moved upward and the semiconductor substrate W is taken out of the chamber 2 without etching the semiconductor substrate W.

The increase in the number of particles turns out to be high values in a range from about 270 to 470 under the condition of setting the electrostatic chuck 3 to a high temperature such as 60° C.

The increase in the number of particles may also depend on cumulative use time of the electrostatic chuck 3 as well.

Accordingly, a well-used electrostatic chuck 3 having cumulative use time of about a half year is employed in the next research B, and the temperature of the electrostatic chuck 3 is set to 60° C. as in the case of the research A. In the research B, however, the semiconductor substrate W is mounted on the electrostatic chuck 3 by moving the lift pins 23 downward, and is taken out of the chamber 2 after etching the semiconductor substrate W.

The increase in the number of particles reaches high values in a range from about 190 to 230 in this case as well.

In the next research C, the electrostatic chuck 3 is replaced with a new component in order to check whether or not the high value mentioned above will reflect the cumulative use time. Note that the conditions in the research C are the same as those in the research B.

As indicated in FIG. 3, the increase in the number of particles reaches high values in a range from about 80 to 340 in the research C as well.

It is evident from the results of the researches A to C that a number of particles are generated irrespective of whether or not etching is performed in the chamber 2, and whether or not the electrostatic chuck 3 is new.

Hence, the inventor of the present application considers that the generation of particles is attributable to the temperature of the electrostatic chuck 3. In the research D, the temperature of the electrostatic chuck 3 is set to 40° C. which is lower than the temperature in the researches A to C. Here, the conditions in the research D are the same as those in the research B except the temperature of the electrostatic chuck 3, and the well-used electrostatic chuck 3 having cumulative use time of about a half year is employed therein.

As indicated in FIG. 3, in the research D, the increase in the number of particles is reduced to about 30 even though the well-used electrostatic chuck 3 is employed therein.

Meanwhile, in the research E, the temperature of the electrostatic chuck 3 is set to 40° C. as in the case of the research D, and a new electrostatic chuck 3 is employed therein. Here, the conditions in the research E are the same as those in the research C except the temperature of the electrostatic chuck 3.

As indicated in FIG. 3, the increase in the number of particles is reduced to about 30 in this case as well.

The results of the researches A to E described above demonstrate the fact that lowering the temperature of the electrostatic chuck 3 at the point when the semiconductor substrate W is mounted is effective for reducing the number of particles irrespective of the cumulative use time of the electrostatic chuck 3 and regardless of whether or not etching is performed inside the chamber 2.

This is thought to be attributed to the following reasons. Specifically, the temperature difference between the electrostatic chuck 3 and the semiconductor substrate W is reduced by lowering the temperature of the electrostatic chuck 3, and thermal expansion of the semiconductor substrate W attributed to the temperature difference is suppressed. Hence, the semiconductor substrate W is rubbed less with the surface of the electrostatic chuck 3 as a result of less thermal expansion.

Suppression of the thermal expansion of the semiconductor substrate W may also be understood from the following formula (1). The formula (1) is a formula expressing a relation between an expansion amount $\Delta L$ of the semiconductor wafer W with respect to its original diameter L and a temperature change $\Delta t$ of the semiconductor substrate W:

$$\Delta L = L \int_{T_b}^{T_a} \alpha \, dt = \alpha L (T_b - T_a) = \alpha L \Delta T \quad (1)$$

Here, $T_a$ denotes the temperature of the semiconductor substrate W before being mounted on the electrostatic chuck 3 and $T_b$ denotes the temperature of the electrostatic chuck 3.

Meanwhile, $\alpha$ is a linear expansion coefficient of the semiconductor substrate W, which is defined by the following formula (2):

$$\alpha = \frac{1}{L} \cdot \frac{dL}{dt} \quad (2)$$

Note that the thermal expansion coefficient $\alpha$ is defined as a constant in the formula (1) regardless of the temperature T because temperature change is little.

It is clearly understood from the formula (1) that the expansion amount $\Delta L$ becomes smaller as the temperature difference $\Delta T$ is smaller.

While the thermal expansion of the semiconductor substrate W is considered as a cause of generation of the particles as described above, the helium gas He used for cooling is also considered as a cause of promoting generation of the particles as described below.

FIGS. 4A to 4D are cross-sectional views schematically illustrating an example of a mechanism in which generation of the particles is promoted by the helium gas He.

In FIGS. 4A to 4D, the same constituents as those explained in conjunction with FIG. 2 are denoted by the same reference numerals appearing in FIG. 2 and relevant explanations will be omitted.

In the following, description will be given of a case in which silicon 30 provided with a silicon oxide film 31 on its surfaces is used as the semiconductor substrate W, and the semiconductor substrate W is to be mounted on the electrostatic chuck 3 at the temperature of 60° C.

Figure 4A:
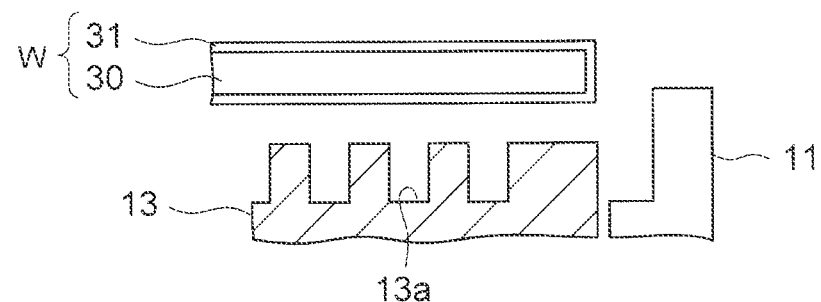
FIGS. 4A to 4D are cross-sectional views schematically illustrating an example of a mechanism in which generation of particles is promoted by helium gas.

First, as illustrated in FIG. 4A, the lift pins 23 (see FIG. 2) are moved upward before the semiconductor substrate W is mounted on the electrostatic chuck 3, and the semiconductor substrate W is therefore detached from the main body 13. Accordingly, the semiconductor substrate W is not heated by the main body 13 at this point and the temperature of the semiconductor substrate W is around a room temperature (20° C.).

A plurality of grooves 13a for circulating the helium gas He are provided on the surface of the main body 13.

Figure 4B:
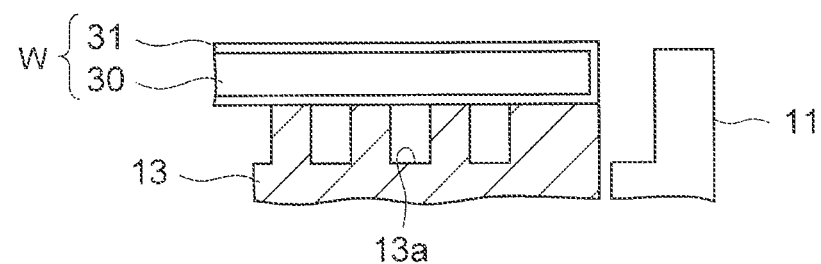

Next, the semiconductor substrate W is mounted on the main body 13 by moving the lift pins 23 (see FIG. 2) downward as illustrated in FIG. 4B.

Thereafter, the semiconductor substrate W is fixed to the main body 13 by the electrostatic attractive force by applying the direct-current voltage V from the direct-current power source 25 (see FIG. 2) to the chuck electrodes 16.

Figure 4C:
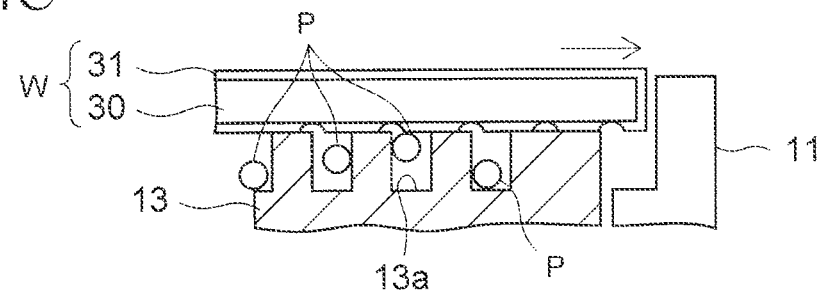

At this time, the semiconductor substrate W expands as indicated with an arrow in FIG. 4C due to the temperature difference between the semiconductor substrate W and the main body 13. Accordingly, the silicon oxide film 31 is rubbed with the surface of the main body 13 and part of the silicon oxide film 31 turns into particles P.

Figure 4D:
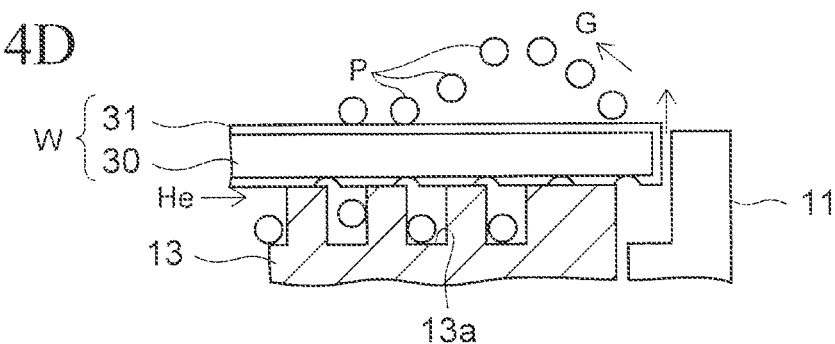

Then, as illustrated in FIG. 4D, when the helium gas He blows on the back surface of the semiconductor substrate W for the purpose of lowering the temperature of the semiconductor substrate W and the like, the particles P are scattered along the flow of the helium gas He. As a consequence, the numerous particles P adhere to the surface of the semiconductor substrate W.

The aspect of the silicon oxide film 31 being peeled off and turning into the particles P has been described above. On the other hand, even if the silicon oxide film 31 is not provided, other particles P adhering to the back surface of the semiconductor substrate W from the beginning may be scattered by the helium gas He instead. Such particles P are likely to adhere to the back surface of the semiconductor substrate W at the time of resist patterning in a process prior to putting the semiconductor substrate W into the chamber 2 or at the time of measurement with a measuring instrument.

Meanwhile, when an etching process takes place by using a plurality of chambers, particles may adhere to the back surface of the semiconductor substrate W when the semiconductor substrate W is processed in one of the chambers to which the semiconductor substrate is transported in the first place. In this case, when the semiconductor substrate W is transported to the subsequent chamber and is mounted on the electrostatic chuck, the particles may be scattered due to the expansion caused by the temperature difference between the semiconductor substrate W and the electrostatic chuck and due to the flow of the helium gas, and then the particles P may adhere to the surface of the semiconductor substrate W.

From the results of the researches described above, the temperature difference between the electrostatic chuck 3 and the semiconductor substrate W at the point of mounting the substrate W on the chuck 3 has been specified as the cause of generation of the particles. It is therefore considered to be effective to reduce the temperature difference between the electrostatic chuck 3 and the semiconductor substrate W as much as possible in order to suppress generation of the particles.

An embodiment designed to suppress generation of the particles by reducing the above-described temperature difference will be described below.

(Embodiment)

In this embodiment, a MOS transistor is manufactured as a semiconductor device by using the semiconductor manufacturing apparatus 1 illustrated in FIG. 1.

FIGS. 5A to 5D are cross-sectional views illustrating a work-in-progress semiconductor device according to the embodiment.

Figure 5A:
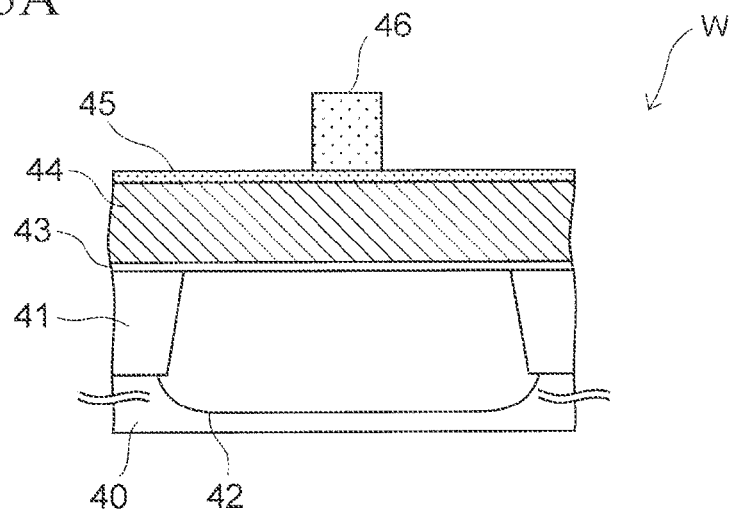
FIGS. 5A to 5D are cross-sectional views illustrating a work-in-progress semiconductor device according to an embodiment.

To begin with, processes before obtaining a cross-sectional structure illustrated in FIG. 5A will be described.

First, trenches for element isolation are formed on a silicon substrate 40 and a silicon oxide film serving as an element isolation insulating film 41 is buried into the trenches. This element isolation structure is called STI (shallow trench isolation). Here, the element isolation may be performed by means of LOCOS (local oxidation of silicon) instead.

Subsequently, a p-well 42 is formed by ion implanting a p-type impurity into the silicon substrate 40.

In addition, an oxide film serving as a gate insulating film 43 is formed in a thickness of about 0.8 nm to 1.2 nm by thermally oxidizing a surface of the silicon substrate 40.

Next, a polycrystalline silicon film 44 in a thickness of about 100 nm to 50 nm is formed on the oxide film in accordance with CVD, and then an organic antireflection film 45 is further formed on the polycrystalline silicon film 44.

Thereafter, a photoresist is coated on the antireflection film 45, and a resist film 46 in the shape of a gate electrode is formed by subjecting the photoresist to exposure and development.

The processes so far provide the semiconductor substrate W to be subjected to etching by the semiconductor manufacturing apparatus 1.

Figure 5B:
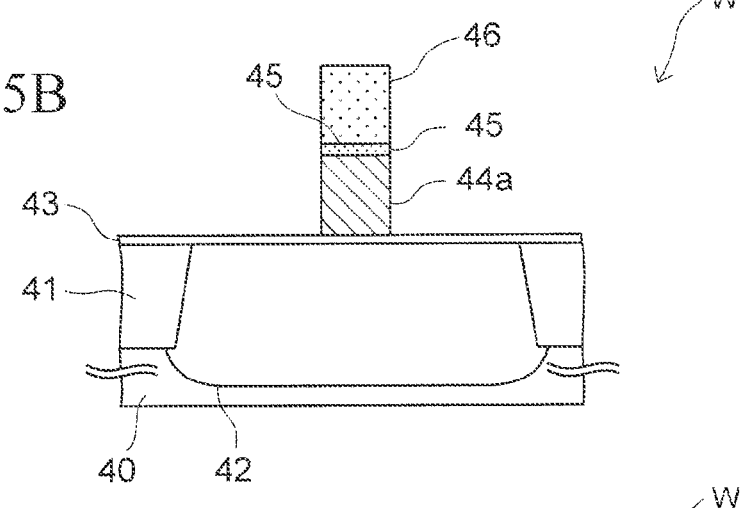

Next, as illustrated in FIG. 5B, the semiconductor substrate W is put into the chamber 2 (see FIG. 1). Then, the polycrystalline silicon film 44 located below the resist film 46 is formed into a gate electrode 44a by dry etching the polycrystalline silicon film 44 while using the resist film 46 as a mask.

A temperature profile during this etching process will be described later in detail.

Figure 5C:
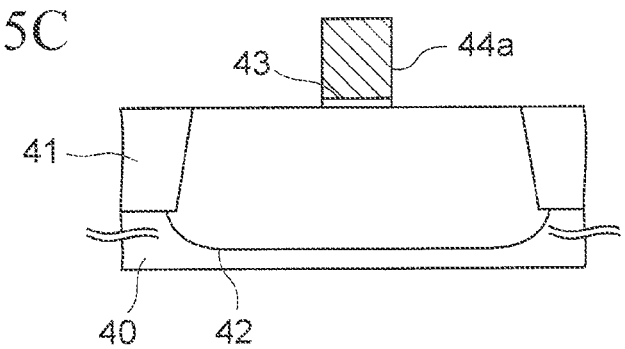

Thereafter, as illustrated in FIG. 5C, the semiconductor substrate W is taken out of the chamber 2, and the portion of the gate insulating film 43 not covered with the gate electrode 44a as well as the antireflection film 45 and the resist film 46 located on the gate electrode 44a are removed.

Figure 5D:
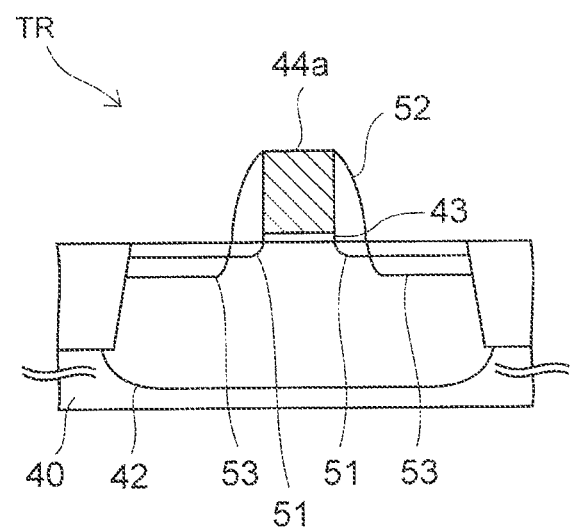

Then, as illustrated in FIG. 5D, low-concentration n-type source-drain extensions 51 are formed at the portion of the silicon substrate 40 beside the gate electrode 44a by ion implantation while using the gate electrode 44a as a mask.

Subsequently, an insulating film is formed on the entire upper surface of the silicon substrate 40, and insulative side walls 52 are formed beside the gate electrode 44a by etching back the insulating film. Here, a silicon oxide film is formed as the insulating film in accordance with CVD, for example.

In addition, high-concentration n-type source-drain regions 53 are formed by ion implanting an n-type impurity into the silicon substrate 40 while using the insulative side walls 52 and the gate electrode 44a collectively as a mask.

In this way, a basic structure of a MOS transistor TR is obtained.

Next, the temperature profile of the electrostatic chuck 3 during the process illustrated in FIG. 5B will be described with reference to FIGS. 6 and 7.

Figure 6:
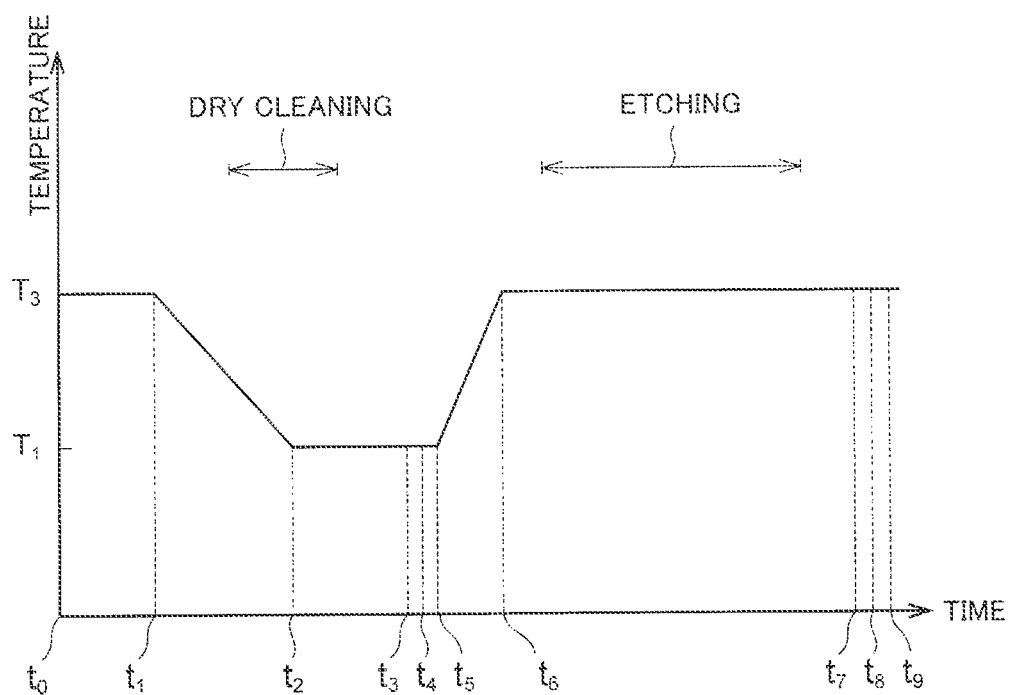
FIG. 6 is a view schematically illustrating a temperature profile of an electrostatic chuck of the embodiment.

FIG. 6 is a view schematically illustrating the temperature profile of the electrostatic chuck 3. Meanwhile, FIG. 7 is a flowchart illustrating a method of controlling the electrostatic chuck 3.

As illustrated in FIG. 6, the temperature of the electrostatic chuck 3 is maintained at an etching temperature $T_3$ at time $t_0$ before the semiconductor substrate W is accepted. Note that the etching temperature $T_3$ is a temperature of the electrostatic chuck 3 at the time of etching a previous semiconductor substrate W, which represents an example of a third temperature.

Although the etching temperature $T_3$ is not particularly limited, the etching temperature $T_3$ is set to about 60° C. in this embodiment.

At this point, the semiconductor substrate W is placed outside the chamber 2. Accordingly, the semiconductor substrate W is maintained at an outside temperature $T_2$ which is lower than the etching temperature $T_3$. Note that the outside temperature $T_2$ represents an example of a second temperature, which is a temperature lower than an acceptance temperature $T_1$. The outside temperature $T_2$ is a room temperature, for example.

Hence, there is a temperature difference equivalent to $T_3 - T_2$ between the semiconductor substrate W and the electrostatic chuck 3. If the semiconductor substrate W is mounted on the electrostatic chuck 3 at this point, the particles are generated as described above due to the temperature difference therebetween.

For this reason, the electrostatic chuck 3 is cooled in a period from time $t_1$ to time $t_2$ so as to bring the temperature of the electrostatic chuck 3 down to the acceptance temperature $T_1$ which is lower than the etching temperature $T_3$ (step S1). The acceptance temperature $T_1$ is an example of a first temperature and is set around 40° C., for example.

Accordingly, the temperature difference between the semiconductor substrate W placed outside the chamber 2 and the electrostatic chuck 3 is reduced to $T_1 - T_2$, which is smaller than the aforementioned temperature difference $T_3 - T_2$.

Although the length of the cooling period $(t_2 - t_1)$ is not particularly limited, the length of the period is set in a range from about 10 seconds to 30 seconds in this embodiment.

Moreover, in this embodiment, the inside of the chamber 2 is subjected to cleaning in the course of cooling the electrostatic chuck 3, thereby removing a reaction product which has adhered to an inner wall of the chamber 2 at the time of etching the previous semiconductor substrate W.

This cleaning process is performed by supplying a cleaning gas from the supply port 5a (see FIG. 1) into the chamber 2 without exposing the chamber to the atmosphere, and then transforming the cleaning gas into a plasma by using the first high-frequency power source 7 and the second high-frequency power source 8. This cleaning process is also referred to as dry cleaning.

Damages on the electrostatic chuck 3 due to the heat may be reduced by performing dry cleaning while cooling the electrostatic chuck 3 as described above.

The cleaning gas to be used in this embodiment is not particularly limited. If silicon is included in the reaction product, then $SF_6$ gas, $NF_3$ gas or the like may be used as the cleaning gas, for example. Alternatively, oxygen gas may be used as the cleaning gas in order to remove an organic substance in the reaction product.

The dry cleaning process is terminated when the temperature of the electrostatic chuck 3 is stabilized at the aforementioned acceptance temperature $T_1$.

Here, the period for performing the dry cleaning process is not particularly limited. For example, the dry cleaning process may be started during the period from the time $t_1$ to $t_2$ when the temperature of the electrostatic chuck 3 is being lowered and may be terminated during this period.

Meanwhile, the dry cleaning process may be performed later than the time $t_2$, after the temperature of the electrostatic chuck 3 is stabilized at the acceptance temperature $T_1$.

In the meantime, the dry cleaning process may be initiated before the time $t_1$ to start cooling.

Next, at time $t_3$, the semiconductor substrate W is placed on the lift pins 23 (see FIG. 2) and then the lift pins 23 are moved downward so as to mount the semiconductor substrate W on the electrostatic chuck 3 (step S2). The period from the time $t_2$ to the time $t_3$ is set in a range from about 10 seconds to 30 seconds.

Here, the temperature difference between the semiconductor substrate W and the electrostatic chuck 3 is reduced to the value $T_1 - T_2$ as described previously. Accordingly, it may be possible to reduce the particles which may be generated due to the temperature difference even when the semiconductor substrate W is mounted on the electrostatic chuck 3.

Although the value of the temperature difference $T_1 - T_2$ is not particularly limited, it is preferable to set the temperature difference $T_1 - T_2$ equal to or below 20° C. in the light of efficiently suppressing generation of the particles.

Subsequently, at time $t_4$, the direct-current voltage V is applied to the chuck electrodes 16 and the semiconductor substrate W is thereby fixed onto the electrostatic chuck 3 with the electrostatic attractive force (step S3).

In this embodiment, the direct-current voltage V having a fixed value is constantly applied to the chuck electrodes 16 without providing a period when the voltage applied to the chuck electrodes becomes equal to 0 V as seen in the conventional method. As a consequence, the electrostatic attractive force is generated at a sufficiently strong level simultaneously with application of the voltage, and fixation of the semiconductor substrate W to the electrostatic chuck 3 therefore takes less time.

Then, the electrostatic chuck 3 is heated during a period from time $t_5$ to time $t_6$, and the temperature of the electrostatic chuck 3 is set to the above-mentioned etching temperature $T_3$ (step S4).

Thereafter, when the temperature of the electrostatic chuck 3 is stabilized at the etching temperature $T_3$, the high-frequency power is applied from each of the first high-frequency power source 7 (see FIG. 1) and the second high-frequency power source 8 to the atmosphere in the chamber 2, thereby etching the semiconductor substrate W (step S5).

Here, the antireflection film 45 is etched in the first place. At this time, a mixed gas prepared by adding any one of $Cl_2$, HBr, and $SO_2$ to oxygen and further adding He gas as a diluents gas thereto is used as the etching gas.

Next, the polycrystalline silicon film 44 (see FIG. 5A) is subjected to an etching process which includes four steps. In the first step, an upper portion of the polycrystalline silicon film 44 is etched by using $CF_4$ or $Cl_2$ gas in order to remove a natural oxide film (not illustrated) which may often be formed on the polycrystalline film 44.

In the next second step, a large portion of the polycrystalline silicon film 44 is etched by using an etching gas, which is a mixed gas of HBr gas, $Cl_2$ gas, $O_2$ gas, and $CF_4$ gas.

In the next third step, the etching gas is changed into a mixed gas of HBr gas and $O_2$ gas, and the remaining portion of the polycrystalline silicon film 44 is subjected to etching. Thus, the gate electrode 44a is formed and the gate insulating film 43 is exposed on the side of the gate electrode 44a.

Then, in the last fourth step, over-etching is performed in such a manner as not to remove the gate insulating film 43, thereby leaving no etching residues on the gate insulating film 43 exposed in the third step. The etching gas used in this step is a mixed gas of HBr gas, $O_2$ gas, and He gas, for example.

After conducting the etching process as described above, application of the direct-current voltage V to the chuck electrodes 16 is stopped at time $t_7$, thereby releasing the semiconductor substrate W from the electrostatic chuck 3 (step S6).

Then, the lift pins 23 are moved upward at time $t_8$ (step S7). After a lapse of a predetermined time period, the semiconductor substrate W is taken out of the chamber 2 by way of a transport robot at time $t_9$ (step S8).

Thus, the basic steps of the method of manufacturing a semiconductor device according to the embodiment are completed.

The processes to be performed on the single semiconductor substrate W have been described above. However, when this embodiment is applied to a mass production facility for semiconductor devices, a plurality of the semiconductor substrates W may be prepared and each semiconductor substrate W may be subjected to the series of the steps S1 to S8.

In this case, the temperature of the electrostatic chuck 3 is cooled down to the above-described acceptance temperature $T_1$ in step S1 at the point after the previous semiconductor substrate W is taken out in step S8 and before step S2 in which another semiconductor substrate W in process is mounted on the electrostatic chuck 3.

Alternatively, the electrostatic chuck 3 may be cooled in a period (step S1) after moving the lift pins 23 upward (step S7) to detach the semiconductor substrate W from the electrostatic chuck 3 and before starting transport of the semiconductor substrate W (step S8). In this way, step 8 and step 1 are carried out concurrently and processing time may therefore be shortened. In this case, it is preferable to clean the chamber 2 after the semiconductor substrate W is taken out of the chamber 2.

According to the above-described embodiment, the temperature difference between the semiconductor substrate W to be accepted and the electrostatic chuck 3 is reduced by cooling the electrostatic chuck 3 in advance in step S1 of FIG. 7. Thus, it may be possible to suppress expansion of the semiconductor substrate W attributed to the temperature difference, to reduce the number of particles generated by the semiconductor substrate W being rubbed with the electrostatic chuck 3 in the course of expansion of the semiconductor substrate W, and to improve yield of the semiconductor devices as a consequence.

Moreover, in this method, the direct-current voltage V having the fixed value is constantly applied to the chuck electrodes 16 in step S3 of FIG. 7. Thus, the time for fixing the semiconductor substrate W to the electrostatic chuck 3 may be made shorter as compared to the conventional example configured to provide the period in which the voltage applied to the chuck electrodes is set to 0 V for the purpose of suppressing generation of the particles.

Furthermore, the electrostatic chuck 3 is provided with a cooling mechanism which uses the coolant C, the helium gas He, and the like from the beginning. Accordingly, the temperature difference between the electrostatic chuck 3 and the semiconductor substrate W may be reduced by using the cooling mechanism without modifying the apparatus. Thus, a mechanism for reducing the temperature difference does not have to be provided outside the chamber 2. In addition, it may be also possible to prevent a drop in throughput which might have been incurred by use of such a mechanism.

Next, an investigation carried out for confirming an effect of the embodiment will be described.

Figure 8A:
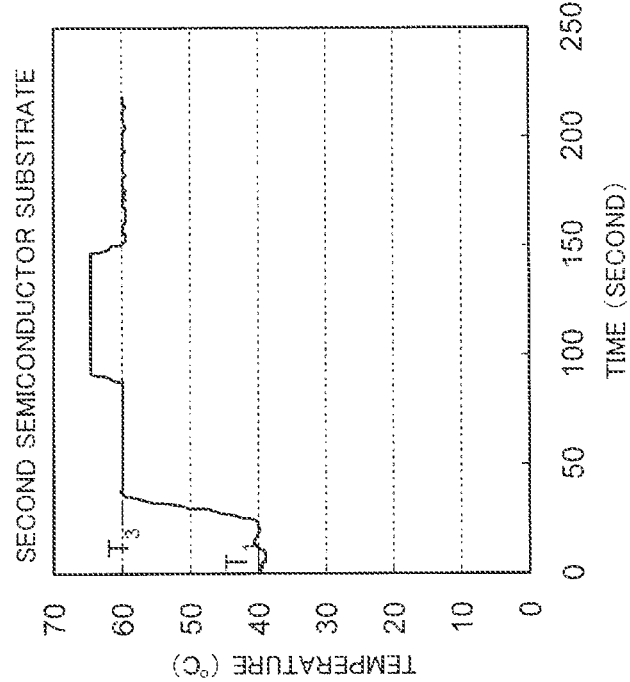
FIGS. 8A and 8B are views illustrating temperature profiles of the electrostatic chuck in an investigation for confirming an effect of the embodiment.
Figure 8B:
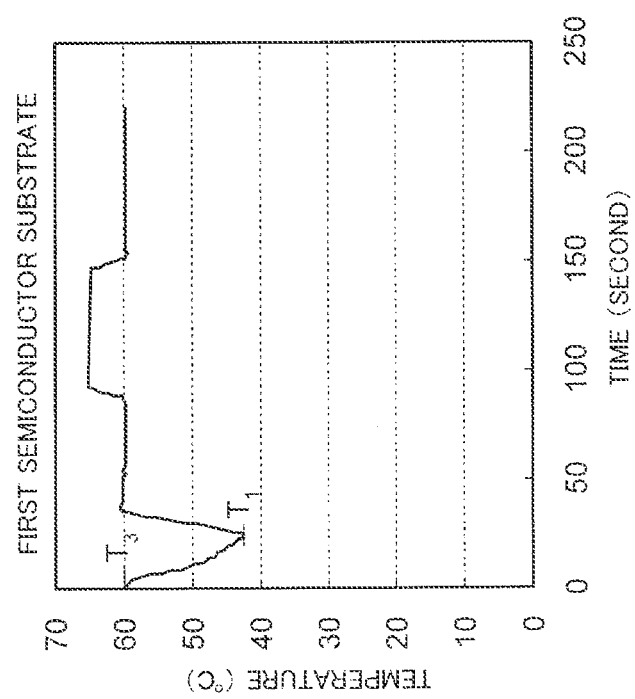

FIGS. 8A and 8B are views illustrating temperature profiles of the electrostatic chuck 3 in the investigation. In the investigation, two silicon wafers are used as the semiconductor substrates W and the silicon wafers are processed under the different temperature profiles.

FIG. 8A is the temperature profile used when the first semiconductor substrate W is processed, and FIG. 8B is the temperature profile used when the second semiconductor substrate W was processed.

In FIGS. 8A and 8B, the point of time when each semiconductor substrate W is fixed onto the electrostatic chuck 3 by application of the direct-current voltage V is defined as the origin of time.

As illustrated in FIG. 8A, in the case of the first semiconductor substrate W, the temperature of the electrostatic chuck 3 is set equal to the etching temperature $T_3$, unlike the embodiment, at time 0 (zero) when the semiconductor substrate W is fixed. Then, after the semiconductor substrate W is fixed, the electrostatic chuck 3 is once cooled down to the acceptance temperature T. Then, the temperature of the electrostatic chuck 3 is increased again to the etching temperature $T_3$.

On the other hand, in the case of the second semiconductor substrate W, the temperature of the electrostatic chuck 3 is cooled down to the acceptance temperature $T_1$ as in the embodiment at the time 0 when the semiconductor is fixed.

Figure 9B:
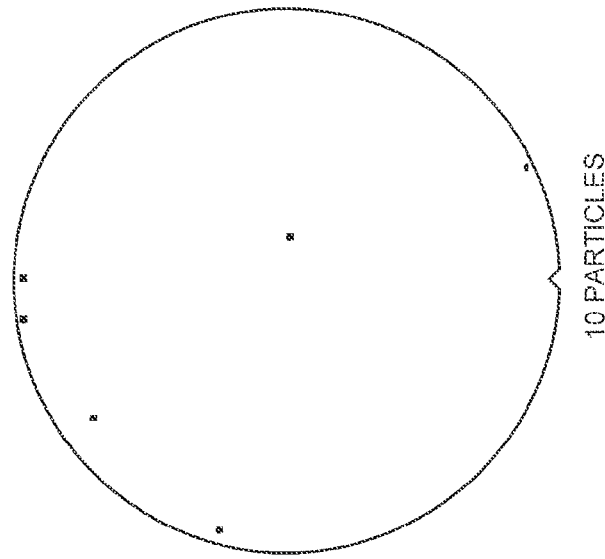
FIGS. 9A and 9B are images obtained by investigating the numbers of particles on semiconductor substrates etched in accordance with the temperature profiles of FIGS. 8A and 8B.
Figure 9A:
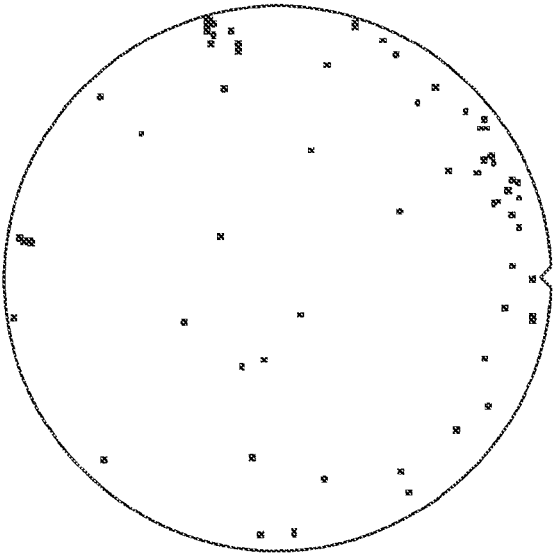

FIGS. 9A and 9B are images obtained by investigating the numbers of particles on the semiconductor substrates W etched in accordance with the temperature profiles of FIGS. 8A and 8B.

Of the images, FIG. 9A represents a result of investigation of the first semiconductor substrate W treated in accordance with the temperature profile of FIG. 8A. Meanwhile, FIG. 9B represents a result of investigation of the second semiconductor substrate W treated in accordance with the temperature profile of FIG. 8B.

As indicated in FIG. 9A, 126 particles are found on the surface of the first semiconductor substrate W. The reason for this is thought to be that the temperature of the electrostatic chuck 3 at the time 0 when the semiconductor substrate W is fixed is set equal to the etching temperature $T_3$, and there is a significant temperature difference between the electrostatic chuck 3 and the semiconductor substrate W which has been retained at the outside temperature $T_2$ around a room temperature before fixation, as illustrated in FIG. 8A.

On the other hand, as indicated in FIG. 9B, the number of particles on the surface of the second semiconductor substrate W is reduced to 10 particles. The reason for this is thought to be that the temperature difference between the electrostatic chuck 3 and the semiconductor substrate W is reduced by lowering the temperature of the electrostatic chuck 3 to the acceptance temperature $T_1$ at the time 0 as similar to the embodiment.

Figure 10B:
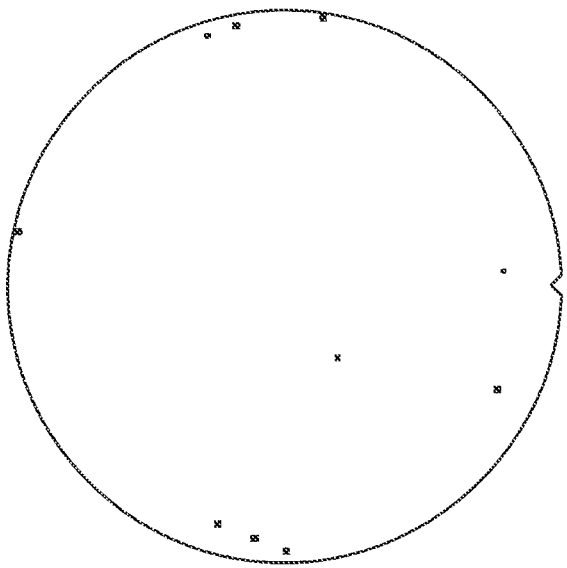
FIGS. 10A and 10B are views illustrating results obtained by carrying out the same investigation as in FIGS. 9A and 9B on two different semiconductor substrates.
Figure 10A:
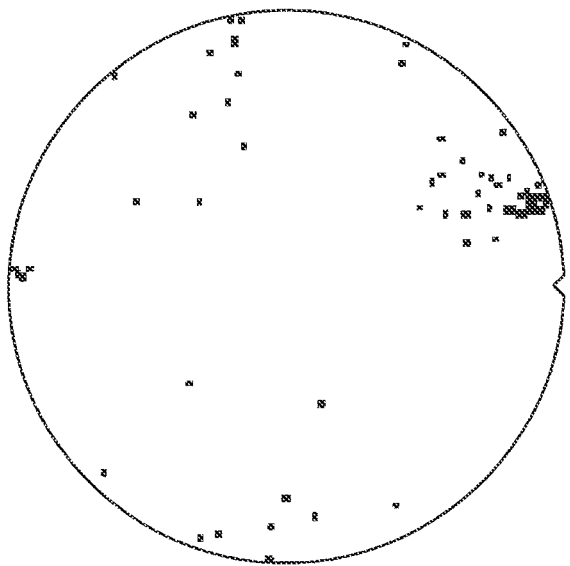

FIGS. 10A and 10B are views illustrating results obtained by carrying out the same investigation as those in FIGS. 9A and 9B on two different semiconductor substrates W. FIG. 10A represents a result of the first semiconductor substrate W of these substrates and FIG. 10B represents a result of the second semiconductor substrate W.

As indicated in FIG. 10A, 204 particles are found on the first semiconductor substrate W. On the other hand, the number of particles on the second semiconductor substrate W is reduced to 26 particles, as indicated in FIG. 10B. Thus, a similar tendency to the investigation illustrated in FIGS. 9A and 9B is observed therein.

From the results of FIGS. 9A, 9B, 10A, and 10B, it is confirmed that the particles may be reduced effectively by cooling the electrostatic chuck 3 and bringing its temperature closer to the temperature of the semiconductor substrate W to be accepted at the point when the semiconductor substrate W is mounted on the electrostatic chuck 3.

Figure 11A:
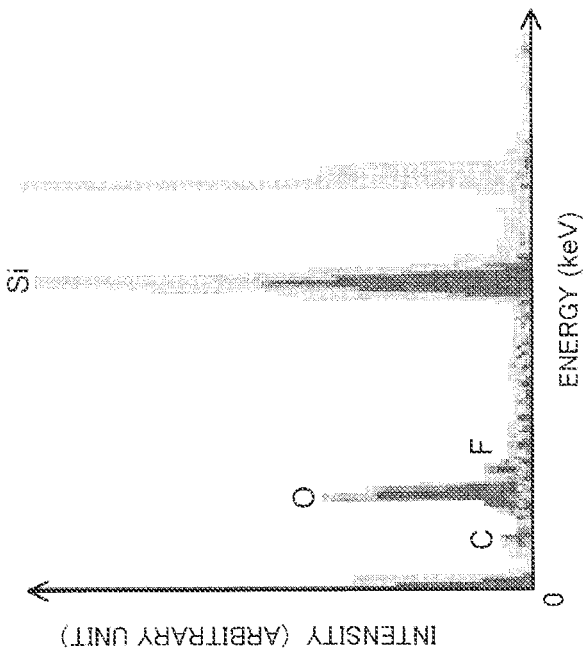
FIGS. 11A and 11B are graphs obtained by analyzing elements constituting the particles.
Figure 11B:
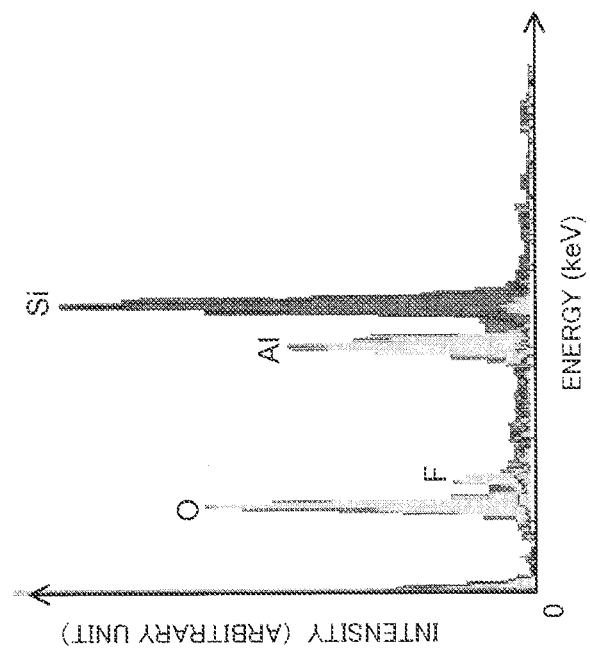

FIGS. 11A and 11B are graphs obtained by extracting two out of the plurality of particles detected in the investigation and analyzing elements constituting each of the particles in accordance with energy dispersive x-ray spectrometry (EDX). The horizontal axis of each graph indicates energy of x-rays emitted from the particle and the longitudinal axis thereof indicates intensity of the x-rays.

As indicated in FIG. 11A, a first particle contains aluminum. As described previously, the material of the main body 13 of the electrostatic chuck 3 is alumina and this particle is therefore considered to be originated from the main body 13.

Meanwhile, as indicated in FIG. 11B, a second particle mainly contains silicon. This particle is therefore considered to be originated from the semiconductor substrate W.

As described above, the particles are originated from various materials. Nonetheless, this embodiment may reduce the number of the particles regardless of the origin.

Although a certain embodiment of the present application has been described above in detail, it is to be understood that the present application is not limited only to the embodiment.

For instance, the embodiment has described the etching process as an example of the process to be performed on the semiconductor substrate W inside the chamber 2. Instead, film deposition on the semiconductor substrate W in accordance with CVD or sputtering may take place as the process.

Meanwhile, instead of controlling the temperature of the electrostatic chuck 3 in the above-described manner, the temperature difference between the electrostatic chuck 3 and the semiconductor substrate W may be reduced by fixing the temperature of the electrostatic chuck 3 to the etching temperature $T_3$, and mounting the semiconductor substrate W onto the electrostatic chuck 3 after the semiconductor substrate W is heated in another chamber.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method of manufacturing a semiconductor device, the method comprising:
   mounting a substrate on an electrostatic chuck placed inside a chamber, the electrostatic chuck having a first temperature and the substrate being retained in advance in an atmosphere having a second temperature lower than the first temperature;
   fixing the substrate onto the electrostatic chuck of the first temperature by constantly applying a voltage to the electrostatic chuck after the mounting;
   heating the electrostatic chuck to a third temperature higher than the first temperature and the second temperature after the fixing the substrate; and
   processing the substrate mounting on the electrostatic chuck of the third temperature after the heating, wherein
   a temperature difference between the first temperature and the second temperature is equal to or below 20° C.

2. The method of manufacturing a semiconductor device according to claim 1, wherein
   a plurality of the substrates are prepared, and
   the mounting a substrate, the fixing the substrate, the heating, and the processing are performed in this order on each of the plurality of the substrates.

3. The method of manufacturing a semiconductor device according to claim 2, the method further comprising:
   taking one of the substrates out of the chamber; and
   setting the temperature of the electrostatic chuck to the first temperature, wherein
   the taking one of the substrates out and the setting the temperature are executed after the processing the one of the substrates and before mounting a subsequent one of the substrates.

4. The method of manufacturing a semiconductor device according to claim 3, the method further comprising:
   performing cleaning inside of the chamber, wherein
   the performing cleaning is executed after the taking one of the substrates out and before the mounting a subsequent one of the substrates.

5. The method of manufacturing a semiconductor device according to claim 4, wherein the cleaning is dry cleaning.

6. The method of manufacturing a semiconductor device according to claim 1, wherein the processing the substrate is an etching the substrate.

7. The method of manufacturing a semiconductor device according to claim 1, wherein the processing the substrate is a depositing a film on the substrate in accordance with any one of chemical vapor deposition or sputtering.

* * * * *

UNITED STATES PATENT AND TRADEMARK OFFICE
CERTIFICATE OF CORRECTION

| | |
|---|---|
| PATENT NO. | : 8,835,327 B2 |
| APPLICATION NO. | : 13/747046 |
| DATED | : September 16, 2014 |
| INVENTOR(S) | : Masanori Terahara et al. |

It is certified that error appears in the above-identified patent and that said Letters Patent is hereby corrected as shown below:

ON THE TITLE PAGE:

At item (73), Assignee, change:

"(73) Assignee: Fujitsu Limited, Kawasaki (JP)"

to

--(73) Assignee: Fujitsu Semiconductor Limited, Yokohama (JP)--.

Signed and Sealed this
Fifth Day of May, 2015

Michelle K. Lee
*Director of the United States Patent and Trademark Office*